United States Patent
Chaffins et al.

(10) Patent No.: US 9,707,766 B2
(45) Date of Patent: Jul. 18, 2017

(54) FLUID DIRECTING ASSEMBLY

(71) Applicant: HEWLETT-PACKARD DEVELOPMENT COMPANY, L.P., Houston, TX (US)

(72) Inventors: Sterling Chaffins, Albany, OR (US); Kevin P. DeKam, Albany, OR (US); Chien-Hua Chen, Corvallis, OR (US)

(73) Assignee: HEWLETT-PACKARD DEVELOPMENT COMPANY, L.P., Houston, TX (US)

( * ) Notice: Subject to any disclaimer, the term of this patent is extended or adjusted under 35 U.S.C. 154(b) by 0 days.

(21) Appl. No.: 15/111,148

(22) PCT Filed: Jan. 29, 2014

(86) PCT No.: PCT/US2014/013538
§ 371 (c)(1),
(2) Date: Jul. 12, 2016

(87) PCT Pub. No.: WO2015/116059
PCT Pub. Date: Aug. 6, 2015

(65) Prior Publication Data
US 2016/0332450 A1    Nov. 17, 2016

(51) Int. Cl.
*B41J 2/175* (2006.01)
*B29B 11/06* (2006.01)
*B41J 2/015* (2006.01)
*B41J 2/16* (2006.01)
*B41J 2/14* (2006.01)

(52) U.S. Cl.
CPC ............... *B41J 2/175* (2013.01); *B29B 11/06* (2013.01); *B41J 2/1603* (2013.01); *B41J 2/1623* (2013.01); *B41J 2/1628* (2013.01); *B41J 2/1629* (2013.01); *B41J 2/1632* (2013.01); *B41J 2/1637* (2013.01);
(Continued)

(58) Field of Classification Search
CPC ....... B41J 2/045; B41J 2/05; B41J 2/14; B41J 2/155; B41J 2/175; B41J 2/1603; B41J 2/1629; B41J 2/1628; B41J 2/1637; B41J 2002/14362; H01L 2924/181; H01L 2924/186; H01L 21/02; H01L 21/50;
(Continued)

(56) References Cited

U.S. PATENT DOCUMENTS

| 4,202,811 A | 5/1980 | Michael et al. |
| 5,510,818 A * | 4/1996 | Shimomura ............ B29C 33/52 347/65 |

(Continued)

FOREIGN PATENT DOCUMENTS

CN    103252999    8/2013

OTHER PUBLICATIONS

Mengel et al. Inkjet Printed Dielectrics for Electronic Packaging of Chip Embedding Modules. Journal Microelectronic Engineering vol. 87, Issue 4; Apr. 2010; pp. 593-593.

*Primary Examiner* — Huan Tran
*Assistant Examiner* — Alexander D Shenderov
(74) *Attorney, Agent, or Firm* — HP Inc.—Patent Department

(57) ABSTRACT

A fluid directing assembly can comprise a molded support comprising a modified epoxy molded compound which includes epoxy resin, cross-linker, filler, and is devoid of wax release agent. The assembly can also include a silicon die attached to the molded support and wherein the silicon die and the molded support define a fluid directing channel.

15 Claims, 2 Drawing Sheets

(52) U.S. Cl.
CPC ............... *B41J 2002/14362* (2013.01); *H01L 2924/181* (2013.01); *H01L 2924/186* (2013.01)

(58) Field of Classification Search
CPC ........ C23C 16/52; C09J 163/00; B29B 11/06; B29K 2063/00
USPC .......................................................... 347/85
See application file for complete search history.

(56) References Cited

U.S. PATENT DOCUMENTS

| | | |
|---|---|---|
| 6,409,307 B1 | 6/2002 | Akhavain et al. |
| 6,800,371 B2 | 10/2004 | Gross et al. |
| 7,429,800 B2 | 9/2008 | Lu et al. |
| 8,132,892 B2 | 3/2012 | Nystrom et al. |
| 2007/0004871 A1 | 1/2007 | Lu et al. |
| 2009/0289994 A1 | 11/2009 | Nystrom et al. |
| 2011/0014354 A1 | 1/2011 | Graham et al. |
| 2011/0279547 A1* | 11/2011 | Hattori ................... B41J 2/1623 347/54 |
| 2012/0182355 A1 | 7/2012 | Graham et al. |
| 2012/0242758 A1 | 9/2012 | Cellura et al. |
| 2013/0076834 A1 | 3/2013 | Nosaka et al. |
| 2013/0088542 A1* | 4/2013 | Hisanaga ................... B41J 2/16 347/20 |

\* cited by examiner

FLUID DIRECTING ASSEMBLY

BACKGROUND

Adhesion between various materials in assemblies used for inkjet architecture present challenges, particularly in environments where high temperatures, non-neutral pH, piezoelectric or thermal actuation, or the like may be present alone or in combination. Furthermore, certain structural elements in inkjet printheads come into direct contact with inks, which can have various pH levels, e.g., high pH inks, and can also include components that can cause damage to contacted surfaces, e.g., surfactants, solvents, ionic additives, etc. For example, inks or components in inks have been known to attack inkjet ink printhead structures, particularly where there may be a structural vulnerability. One such location can be where two structures are attached together at a joint. By improving structural integrity of these joints, reliability of the inkjet printhead can be likewise improved. Thus, it would be desirable to provide improved structural integrity, particularly at the joints in printhead structures.

DETAILED DESCRIPTION

Figure 1:
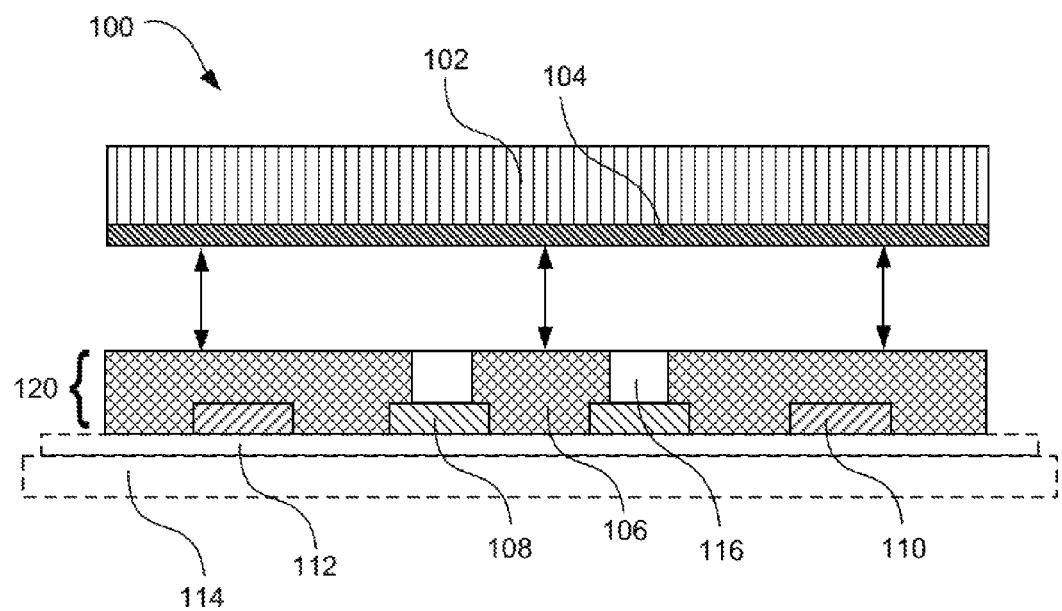
FIG. 1 is a schematic cross-sectional representation of a portion of a printhead, including a fluid directing assembly, in accordance with examples of the present disclosure.

This present disclosure is drawn to systems and methods where modified epoxy molding compounds are used to provide enhanced joint strength and/or adhesion in inkjet printheads. In particular, the present disclosure can provide enhanced strength and integrity of joints that may be present on a fluid directing device portion of the printhead compared to other state of the art fluid directing systems. As an initial matter, it is noted that the term "printhead" herein includes both scanning printhead assemblies as well as static printbar assemblies.

Epoxy molding compounds are materials that are typically used in electrical packaging applications and often include epoxy resin, cross-linker, filler, catalyst, wax release agents, as well as other materials. In these applications, the wax release agent is included to assist in release of the molding compound during the molding process. These materials work well for many applications, but with inkjet printheads, particularly where there is direct contact between caustic or other chemically active inkjet inks (e.g., high pH, various solvents and/or surfactants, etc.) and/or high temperatures (e.g., thermal inkjet printheads), the adhesion of such materials are often not strong enough to provide long lasting adherence at various material interfaces. More specifically, joints that are exposed to such inks are at the most risk. To reduce cost and provide other structural and processing advantages, in accordance with examples of the present disclosure, a modified epoxy molding compound without the presence of wax release agents can be used to create a monolithic fluid directing assembly that can be included in a printhead. Essentially, certain printhead elements, such as the silicon die, printed circuit boards, and the like, can be molded in contact with the modified epoxy molding compound, and enhanced joint strength can often be achieved.

In accordance with this, epoxy molding compounds can be modified to provide improved adherence to various substrate surfaces, and as a result work well even when maintained in direct contact with inkjet inks. For example, by removing the wax release agent, a stronger bond can be achieved. Because the wax release agents are removed, standard release techniques typically used with these materials often become impractical, and thus, can be replaced with alternative processing steps.

Thus, in one example, the present disclosure is drawn to a fluid directing assembly, comprising a molded support associated with a silicon die. A fluid directing channel can be etched or otherwise formed in the molded support such that the molded support and the silicon die co-define the fluid directing channel. Thus, the molded support can be molded in contact with the silicon die. To form the molded support, a modified epoxy molding compound which includes at least epoxy resin, cross-linker, and filler, and is devoid of wax release agent, is molded in contact with the silicon die to form a joint, and optionally other structures such as a printed circuit board or other circuitry, can also be molded in contact thereof. The modified epoxy molding compound can optionally include a catalyst or other additives known in the art.

In another example, a printhead for inkjet printing can comprise the fluid directing assembly described herein, a printhead body, and an adhesive adhered between the fluid directing assembly and the printhead body.

In another example, a method of molding a fluid directing assembly for an inkjet printhead can include various steps. For example, the method can include lining a mold with a thermal release material and placing a silicon die on the thermal release material. Additional steps can include distributing a particulate composition of a modified epoxy molding compound described herein into the mold lined with the thermal release material and in contact with the silicon die. Once in place, the particulate composition can be rapidly heated and compressed while within the mold and in contact with the thermal release material and silicon die. Once formed, the fluid directing assembly is removed from the mold and from contact with the thermal release material. The modified epoxy molding compound forms a molded support and a joint where the molded support interfaces with the silicon die exhibits strong adhesive strength that is resistant to ink degradation.

In each of the various embodiments described herein, whether discussing the assemblies or related methods, there may be some common features that further characterize options in accordance with principles discussed herein. As an example, any discussion of the fluid directing assembly or methods, either alone or in combination, is also applicable to the other embodiment not specifically mentioned. For example, a discussion of the silicon die in the context of the fluid directing device is also applicable to the related method, and vice versa.

Turning now to the FIGS., FIG. 1 is a schematic cross-sectional representation of a portion of a printhead 100 and its assembly, including a fluid directing assembly 120, in accordance with examples of the present disclosure is shown. The printhead includes a printhead body 102, which is essentially the balance of the printhead to which the fluid directing assembly is attached via an adhesive 104. The adhesive is shown as being attached to the printhead body, but it is understood that it is the adhesive that is used to join the printhead body to the fluid directing assembly. Typical structures that may be present on a printhead body can include an ink delivery system, microfluidic elements, an ink repository, and an manifold assembly, though this can vary from printbar to printhead. For example a static printbar may include different structures than mobile carriage-type printhead. The adhesive can be any adhesive known in the art that can be used for adhering structures together in a printhead, such as, without limitation, plastics, metals, ceramics, etc. It is noted that because there is no wax release agent present in the fluid directing assembly, an added benefit provided by the fluid directing assemblies of the present disclosure can be that these structures can provide a strong bond between the fluid directing assembly and printhead body.

In further detail regarding the fluid directing assembly 120 and its fabrication process, FIG. 1 further depicts a molded support 106 that is prepared from a modified epoxy molding compound. As mentioned, the modified epoxy molding compound includes epoxy resin, cross-linker, and filler, and is devoid of wax release agent. In some examples, a catalyst can also be included. Essentially, a mold 114 is lined with release material 112 (e.g., release tape such as 3195V release tape, from Nitto Denko). The mold shown here is flat, but it is understood that a mold of any shape can be used. Additionally, a top mold (also lined with release material) is also typically used to form the fluid directing assembly, but it is not shown here for clarity in depicting the assembly with the printhead body. Essentially, in this example, a silicon die 108 (or multiple silicon dice) are positioned on the release material. Additionally, optionally, circuitry such as a printed circuit board 110 is also place on the release material. The modified epoxy molded compound is then applied as a particulate to the release material lined within the mold. For consistency in one example, the modified epoxy molded compound can be shaken for even distribution of the particulate in order to approximate the shape of the mold. Once the particulate is in place, the modified epoxy compound particulate is rapidly heated at from room temperature to 180° C., or more particularly form 120° C. to 180° C., and then compressed with the top mold (also lined with release material) to form the molded substrate having silicon die (and optionally other) features bonded therewith. Once formed, the release material and mold can be removed. Steps at any reasonable point in time can then be taken (if not already by the shape of the mold) to form channels 116 by chemical etching, saw, laser molding, laser ablation, drill, etc., or by any other known process. Also, as indicated by the arrows, the fluid directing assembly can be joined with the printhead body 102 via the adhesive 104.

Figure 2:
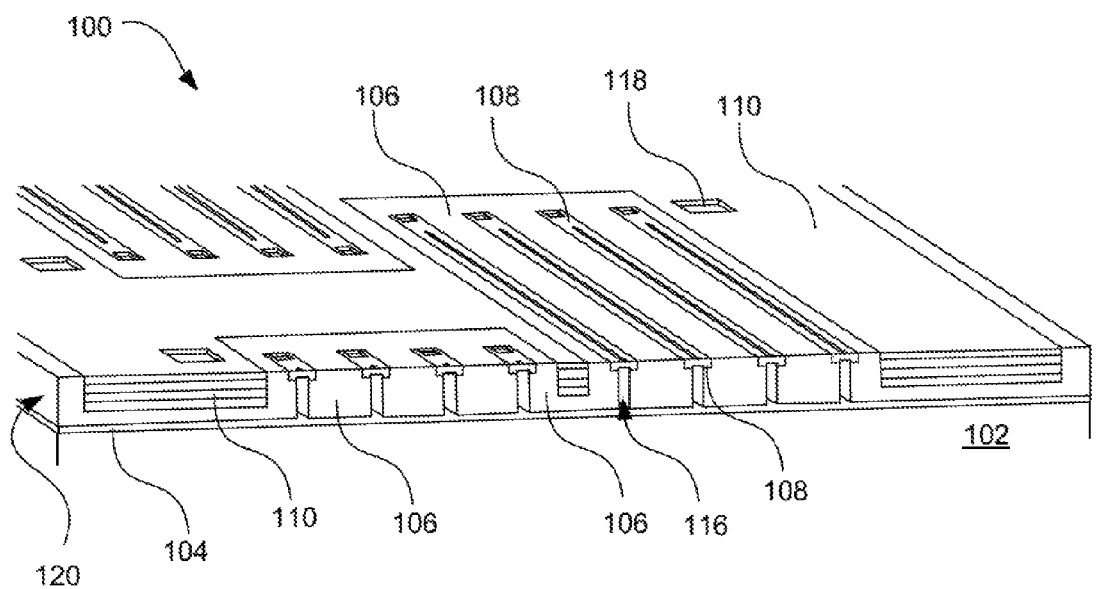
FIG. 2 is a perspective view of a portion of a printhead, including a fluid directing assembly, in accordance with examples of the present disclosure.

FIG. 2 is a perspective view of a portion of a printhead 100, including a fluid directing assembly 120, in accordance with examples of the present disclosure. Essentially, the structures shown and described in schematic FIG. 1 are also shown in FIG. 2 as a perspective view, but the structure is shown as a portion of an assembled printhead after removal of the mold, release material, and after adhering the printhead body 102 to the fluid directing assembly via the adhesive 104. Also, it is noted that the assembly is inverted when compared to FIG. 1. Again, the fluid directing body as shown here includes a molded substrate 106, a silicon die 108 (or dice), circuitry in the form of a printed circuit board 110, and fluid directing channels 116. Also shown are printed circuit board features 118 for exemplary purposes.

Figure 3:
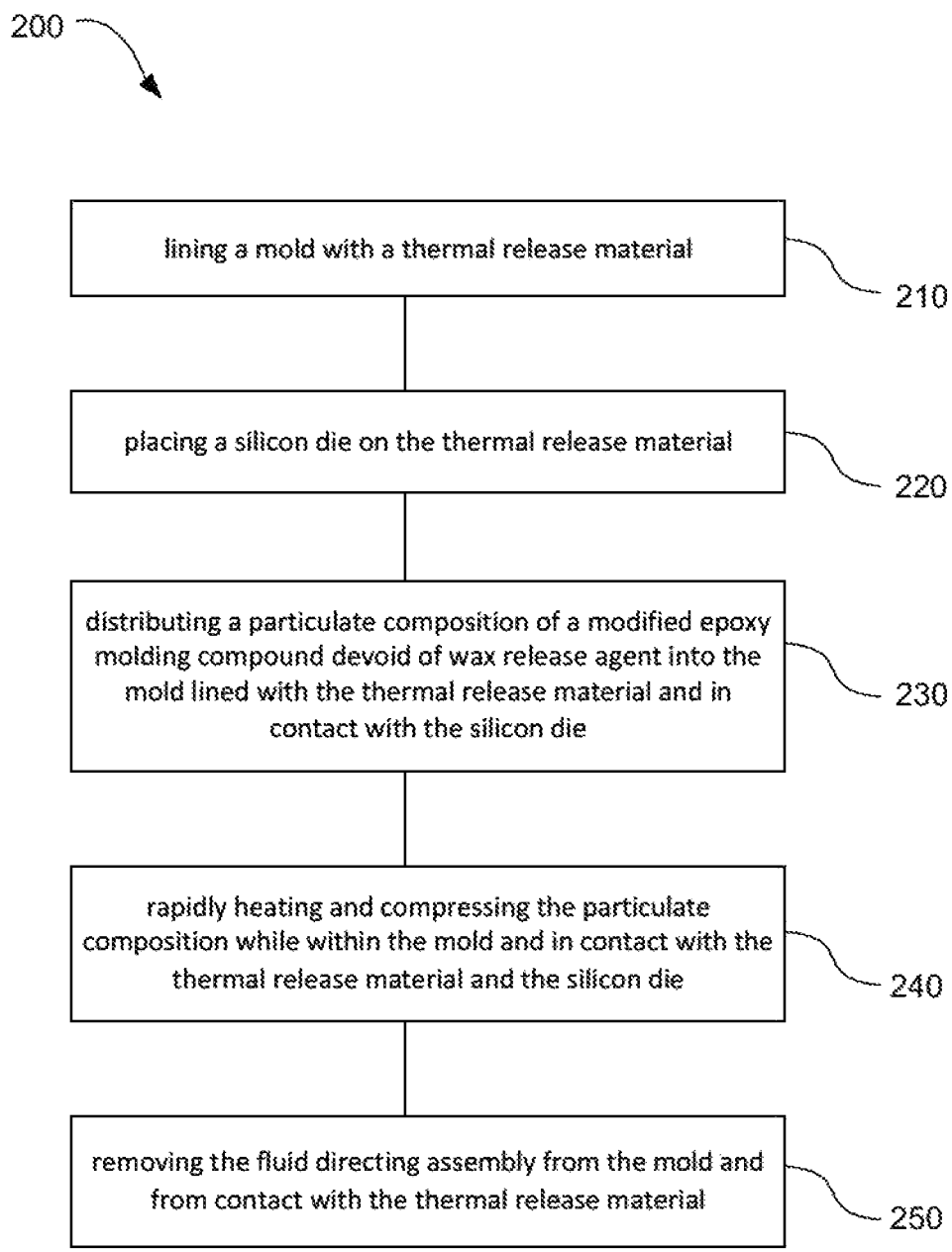
FIG. 3 is a flow chart depicting an exemplary method in accordance with examples of the present disclosure.

FIG. 3 provides a flow diagram for a method that can be carried out in accordance with examples of the present disclosure. Essentially, a method 200 of molding a fluid directing assembly for an inkjet printhead can comprise steps of lining 210 a mold with a thermal release material; placing 220 a silicon die on the thermal release material; and 230 distributing a particulate composition of a modified epoxy molding compound devoid of wax release agent into the mold lined with the thermal release material and in contact with the silicon die. Additional steps can include rapidly heating and compressing 240 the particulate composition while within the mold and in contact with the thermal release material and silicon die; and removing 250 the fluid directing assembly from the mold and from contact with the thermal release material.

Regarding the method, and as also described with respect to FIG. 1, the particulate composition can be shaken to distribute the particulate composition throughout mold prior to rapidly heating and compressing. The step of rapidly heating can be at a temperature ranging from room temperature to 180° C. (or from 120° C. to 180° C.) for from 1 to 2400 seconds, and the step of compressing can be at a mechanical clamping pressure of 1 KN to 150 KN (Kilonewtons). Furthermore, in addition to the silicon die, the method can also include integrating a circuit board into the fluid directing assembly by placing the circuit board on the thermal release material, distributing the particulate composition around the circuit board, and rapidly heating and compressing the particulate composition while in contact with the circuit board. Furthermore, in another example, the step of forming a fluid directing channel in the fluid directing assembly can be carried out such that a molded portion of the modified epoxy molding compound and the silicon die at least partially co-define the channel.

To provide some examples of useable epoxy molding compounds that can be used effectively in accordance with examples of the present disclosure, such a composition can include from 1 wt % to 25 wt % of epoxy resin, such as Araldite EPN-1180 from Huntsman Chemical, Araldite ECN1273 from Huntsman Chemical, or DER 3581 from DOW; from 1 wt % to 25 wt % cross-linker, such as Bisphenol-A from Aldrich, Aradur 3275 from Huntsman Chemical, or DEH 613 from DOW; and from 40 wt % to 95 wt % of a silica filler such as fumed silica, fused silica, or alumina. It is noted that in some examples, a catalyst can be included, and if present, it can be included at from 0.1 wt % to 2 wt %. Examples of such catalysts can be triphenylphosphine from Aldrich or Curezol 2E4MZ from Air Products, for example. It is noted that the filler can be unmodified, or can be further functionalized with a surface modifying chemistry such as a silane coupling agent.

As mentioned, the epoxy molding compound described herein is devoid of wax release agents; however, other additives can be present provided they do not destroy the bonding properties of the modified epoxy compound. By removing the wax release agents, and in some cases, lowering the silica filler content below what is typically used for electronics packaging, greater adhesive strength can be achieved. However, due to the greater adhesive strength, the process of molding this material can be carried out using thermal release material, e.g., tape, and compressing molding techniques. By using the removable thermal release tape instead of formulations with wax release agents, once the thermal release tape is removed, a stronger adhesive is left behind without the detrimental impact of the wax additives remaining in the molded part. As mentioned, this enhanced adhesive strength is particularly beneficial for molded parts that will be in close contact with inkjet inks and/or other caustic fluid compositions.

EXAMPLES

The following examples illustrate properties of the present disclosure. However, it is to be understood that the following are only exemplary or illustrative of the application of the principles of the present devices and methods. Numerous modifications and alternative devices and methods may be devised by those skilled in the art without departing from the spirit and scope of the present compositions and methods. The appended claims are intended to cover such modifications and arrangements. Thus, while the present examples have been described above with particularity, the following provides further detail in connection with what are presently deemed to be the acceptable embodiments.

Example 1

Modified epoxy molding compounds are prepared in accordance with Tables 1-3, as follows:

TABLE 1

Modified Epoxy Molding Compound 1

| Ingredient | Class | Supplier | Amount |
| --- | --- | --- | --- |
| EPN1180 | Epoxy Resin | Huntsman | 21.56 wt % |
| Bisphenol-A | Cross-linker | Aldrich | 13.77 wt % |
| Triphenylphosphine | Catalyst | Aldrich | 0.18 wt % |
| FB-940 Fused Silica | Filler | Ex Denka | 64.4 wt % |

TABLE 2

Modified Epoxy Molding Compound 2

| Ingredient | Class | Supplier | Amount |
| --- | --- | --- | --- |
| Araldite ECN1273 | Epoxy Resin | Huntsman | 15 |
| Aradur 3275 (Polyetherpolyamine) | Cross-linker | Huntsman | 20.18 |
| Curezol 2E4MZ (2-ethyl-4-methylimidazole) | Catalyst | Air Products | 0.32% |
| Cab-O-Sil TS-720 (Fumed Silica with Epoxy Adhesive) | Filler | Cabot | 64.5% |

TABLE 3

Modified Epoxy Molding Compound 3

| Ingredient | Class | Supplier | Amount |
| --- | --- | --- | --- |
| DER 3581 | Epoxy Resin | DOW | 16.6 |
| DEH 613 (Phenolic Hardener) | Cross-linker | DOW | 18.86 |
| None | Catalyst | NA | NA |
| DAM-45 (Alumina) | Filler | Ex Denka | 64.5 |

Example 2—Preparation of a Fluid Directing Assembly

The modified epoxy molding compound described in Table 1 (Epoxy Molding Compound 1) is prepared to form a particulate or powder having an average particle size of about 13.1 um. A release tape (3195V from Nitto Denko; PAS facing carrier) is lined in a mold, and into the release tape-lined mold is placed a plurality of silicon die and a plurality of printed circuit boards. A heating element, which is also the mold in this example, is used to apply heat to the powder at about 150° C. for about 5-10 seconds. After the powder is sufficiently (fluid) flowable within about 5 to 10 seconds, a top portion of the mold also lined with the release tape is clamped down on the epoxy molding compound at a clamp pressure of about 77 KN for about 10 minutes while at 150° C. After removing the mold and the release tape (at room temperature), the assembly is heated for an additional hour for post mold curing. Fluid directing channels can then be etched into the molded substrate prepared from the modified epoxy molding compound. Typically, the channels are defined by the molded substrate and the silicon die (and an inkjet body once bonded thereto).

While the disclosure has been described with reference to certain embodiments, those skilled in the art will appreciate that various modifications, changes, omissions, and substitutions can be made without departing from the spirit of the disclosure. It is intended, therefore, that the present disclosure be limited only by the scope of the following claims.

What is claimed is:

1. A fluid directing assembly, comprising:
   a molded support comprising a modified epoxy molded compound which includes epoxy resin, cross-linker, and filler, and is devoid of wax release agent; and
   a silicon die attached to the molded support,
   wherein the silicon die and the molded support define a fluid directing channel.

2. The fluid directing assembly of claim 1, further comprising a circuit board attached to the molded support.

3. The fluid directing assembly of claim 2, wherein the silicon die and the circuit board are attached to the molded support by a heating and compressing the modified epoxy molding compound around the silicon die and the circuit board.

4. The fluid directing assembly of claim 2, wherein the circuit board is a printed circuit board.

5. The fluid directing assembly of claim 1, wherein the fluid directing assembly includes a plurality of silicon dice and a plurality of fluid directing channels associated therewith.

6. The fluid directing assembly of claim 1, wherein the epoxy resin is present at from 1 wt % to 25 wt %, the cross-linker is present at from 1 wt % to 25 wt %, and the filler is present at from 40 wt % to 95 wt %.

7. The fluid directing assembly of claim 1, wherein the cross-linker is a Bisphenol-A, polyetherpolyamine, or a phenolic hardener.

8. The fluid directing assembly of claim 1, wherein the filler is alumina, fused silica, or fumed silica.

9. The fluid directing assembly of claim 1, wherein the modified epoxy molding compound further comprising a catalyst.

10. A printhead for inkjet printing, comprising:
    the fluid directing assembly of claim 1 having a fluid directing channel therein defined by the silicon die and the molded support; and
    a printhead body bonded to the fluid directing assembly to close the fluid directing channel.

11. A method of holding a fluid directing assembly for an inkjet printhead, comprising:
    lining a mold with a thermal release material;
    placing a silicon die on the thermal release material;
    distributing a particulate composition of a modified epoxy molding compound devoid of wax release agent into the mold lined with the thermal release material and in contact with the silicon die;

rapidly heating and compressing the particulate composition while within the mold and in contact with the thermal release material and the silicon die; and removing the fluid directing assembly from the mold and from contact with the thermal release material.

12. The method of claim 11, wherein the particulate composition is shaken to distribute the particulate composition throughout mold prior to rapidly heating and compressing.

13. The method of claim 11, wherein step of rapidly heating is at a temperature ranging from 120° C. to 180° C. for from 1 minute to 20 minutes, and the step of compressing is at a mechanical clamping pressure of 1 kN to 150 kN.

14. The method of claim 11, further comprising integrating a circuit board into the fluid directing assembly by placing the circuit board on the thermal release material, distributing the particulate composition around the circuit board, and rapidly heating and compressing the particulate composition while in contact with the circuit board.

15. The method of claim 11, further comprising the step of forming a fluid directing channel in the fluid directing assembly, said fluid directing channel defined by a molded portion of the modified epoxy molding compound and the silicon die.

* * * * *

UNITED STATES PATENT AND TRADEMARK OFFICE
CERTIFICATE OF CORRECTION

PATENT NO. : 9,707,766 B2
APPLICATION NO. : 15/111148
DATED : July 18, 2017
INVENTOR(S) : Sterling Chaffins et al.

It is certified that error appears in the above-identified patent and that said Letters Patent is hereby corrected as shown below:

In the Claims

In Column 6, Line 60, in Claim 11, delete "holding" and insert -- molding --, therefor.

Signed and Sealed this
Twenty-second Day of May, 2018

Andrei Iancu
*Director of the United States Patent and Trademark Office*